United States Patent
Pierrat (12)

(10) Patent No.: US 6,635,393 B2
(45) Date of Patent: Oct. 21, 2003

(54) BLANK FOR ALTERNATING PSM PHOTOMASK WITH CHARGE DISSIPATION LAYER

(75) Inventor: Christophe Pierrat, Santa Clara, CA (US)

(73) Assignee: Numerical Technologies, Inc., Mountain View, CA (US)

(*) Notice: Subject to any disclaimer, the term of this patent is extended or adjusted under 35 U.S.C. 154(b) by 219 days.

(21) Appl. No.: 09/816,619

(22) Filed: Mar. 23, 2001

(65) Prior Publication Data

US 2002/0136964 A1 Sep. 26, 2002

(51) Int. Cl.[7] .............................. G03F 9/00; G03C 5/00; G06F 17/50
(52) U.S. Cl. .............................. 430/5; 430/311; 716/19
(58) Field of Search .............................. 430/5, 311, 312, 430/313, 322, 324, 296; 716/19, 21

(56) References Cited

U.S. PATENT DOCUMENTS

| | | | |
|---|---|---|---|
| 4,037,918 A | 7/1977 | Kato | 350/3.5 |
| 4,456,371 A | 6/1984 | Lin | 355/71 |
| 5,302,477 A | 4/1994 | Dao et al. | 430/5 |
| 5,308,741 A | 5/1994 | Kemp | 430/312 |
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,472,814 A | 12/1995 | Lin | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |

(List continued on next page.)

FOREIGN PATENT DOCUMENTS

| | | |
|---|---|---|
| DE | 195 45 163 A1 | 6/1996 |
| EP | 0 437 376 A2 | 7/1991 |

(List continued on next page.)

OTHER PUBLICATIONS

Lin, B.J., et al., "Single–Level Electric Testsites for Phase–Shifting Masks", SPIE, vol. 1673, pp. 221–228, Mar. 9–11, 1992.

Cooke, M., "OPC/PSM Designs For Poly Gate Layers", European Semiconductor, vol. 22, No. 7, pp. 57–59, Jul. 2000.

(List continued on next page.)

*Primary Examiner*—S. Rosasco
(74) *Attorney, Agent, or Firm*—Bever, Hoffman & Harms, LLP; Jeanette S. Harms

(57) ABSTRACT

A conductive blank enables election beam (e-beam) patterning rather than optical patterning for the phase level etch of a phase-shifting mask (PSM) photomask. The conductive blank includes a conductive layer between a chrome (pattern) layer and a quartz substrate. The chrome layer is patterned with in-phase and phased features, and then is recoated with a resist layer. An e-beam exposure tool exposes the resist layer over the phased features. The still intact conductive layer under the chrome layer dissipates any charge buildup in the resist layer during this process. A phase level etch then etches through the conductive layer and creates a pocket in the quartz. A subsequent isotropic etch through both the in-phase and phased features removes the conductive layer at the in-phase features and improves exposure radiation transmission intensity. Alternatively, a visually transparent conductive layer can be used, eliminating the need to etch through the in-phase features.

43 Claims, 14 Drawing Sheets

U.S. PATENT DOCUMENTS

| | | | |
|---|---|---|---|
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,538,816 A * | 7/1996 | Hashimoto et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,847 A | 12/1997 | Tarumoto et al. | 430/5 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,827,623 A | 10/1998 | Ishida et al. | 430/5 |
| 5,858,580 A | 1/1999 | Wang et al. | 430/5 |
| 5,885,734 A | 3/1999 | Pierrat et al. | 430/5 |
| 5,922,497 A | 7/1999 | Pierrat | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,010,807 A | 1/2000 | Lin | 430/5 |
| 6,057,063 A | 5/2000 | Liebmann et al. | 430/5 |
| 6,066,180 A | 5/2000 | Kim et al. | 716/19 |
| 6,077,630 A | 6/2000 | Pierrat | 430/5 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,180,291 B1 * | 1/2001 | Bessy et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,406,924 B1 * | 6/2002 | Grimbergen et al. | 438/9 |
| 6,420,074 B2 | 7/2002 | Wang et al. | 430/5 |
| 6,436,590 B2 | 8/2002 | Wang et al. | 430/5 |
| 2001/0000240 A1 | 4/2001 | Wang et al. | 430/5 |
| 2001/0028985 A1 | 10/2001 | Wang et al. | 430/5 |
| 2002/0009653 A1 * | 1/2002 | Kawada et al. | 430/5 |
| 2002/0083410 A1 | 6/2002 | Wu et al. | 716/19 |
| 2002/0127479 A1 | 9/2002 | Pierrat | 430/5 |
| 2002/0129327 A1 | 9/2002 | Pierrat et al. | 716/19 |
| 2002/0132174 A1 | 9/2002 | Pierrat | 430/5 |
| 2002/0136964 A1 | 9/2002 | Pierrat | 430/5 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| EP | 0 464 492 A1 | 1/1992 |
| EP | 0 653 679 A2 | 5/1995 |
| EP | 0 698 821 | 2/1996 |
| GB | 2333613 A | 7/1999 |
| JP | 62067547 | 3/1987 |
| JP | 2-140743 | 5/1990 |
| JP | 7-111528 | 2/1991 |
| JP | 6-67403 | 3/1994 |
| JP | 8-51068 | 2/1996 |
| JP | 2650962 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Granik, Y., et al., "Sub–Resolution Process Windows And Yield Estimation Technique Based On Detailed Full–Chip CD Simulation". SPIE, vol. 4182, pp. 335–341 (2000).

Plat, M., et al., "The Impact of Optical Enhancement Techniques on the Mask Error Enhancement Function (MEEF)". SPIE, vol. 4000, pp. 206–214, Mar. 1–3, 2000.

Mansuripur, M., et al., "Projection Photolithography", Optics & Photonics News 11, 17 pages, Feb. 2000.

Article entitled: Phase–Shifting Mask Topography Effects on Lithographic Image Quality; C. Pierrat, A. Wong & S. Vaidya; pp. 3.3.1 thru 3.3.4.

Wang, R., et al., "Plarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Kawata, A., et al., "Spray Developer for ZEP7000", Nippon Zeon Co., Ltd, Hoya Corporation (8 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Hirai, Y., et al., "Automatic Pattern Generation System for Phase Shifting Mask", 1991 Symposium of VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.41–27.44 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Kurihara, M., et al., "Primary Processes in E–Beam and Laser Lithographies for Phase–Shift Mask Manufcturing II", SPIE—12th Annual Symposium on Photomask Technology and Management, vol. 1809, pp. 50–61, Sep. 23–24, 1992.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Miyashita, H., et al., "Manufacturing of Half–Tone Phase Shift Masks II. Writing and Process", SPIE, vol. 2254, pp. 248–260, Apr. 22, 1994.

Mohri, H., et al., "Manufacturing of Half–Tone Phase Shift Masks I. Blank", vol. 2254, pp. 238–247, Apr. 22, 1994.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Kikuchi, K., et al., "Method of Expanding Process Window for the Double Exposure Technique with alt–PSMS", Optical Microlithography XIII, Processing of SPIE, vol. 4000, pp. 121–131 (2000).

Schmidt, R., et al., "Impact of Coma on CD Control for Multiphase PSM Designs", AMD, ASML (11 pages).

Erdmann, A., "Tophgraphy Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photonics, Inc., MIT Lincoln Lab, ARCH Chemicals, Finle Technologies, KLATencor Corp. (10 pages).

Ronse, K., et al., "Thin Film Interference Effects in Phase Shifting Masks Causing Phase and Transmittance Errors", IMEC (15 pages).

Rosenbluth, A., et al., "Optimum Mask and Source Patterns to Print a Given Shape", IBM (17 pages).

Sakata, M., et al., "A Novel Radiaion Sensitive Spin–on––Glass Convertible into SiO2 and the Simple Fabrication Process Using It", Oki Electric Industry Co. Ltd. (3 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=–.3 Lithogrpahy", Canon Inc. (13 pages).

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fuitsu Limited (11 pages).

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self––Aligned Phase Sifters for a Quarter Micron Photolithography", IEDM, pp. 3.3.1–3.3.4, Dec. 3–6, 1989.

Toh, K., et al., "Chromeless Phase–Shifted Masks: A New Approcah to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Burggraaf, P., "Lithography's Leading Edge, Part 1: Phase–Shift Technology and Part 2:I–Line and Beyond", Semiconductor International, pp. 43–47 and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp 1 & 4–6, Jun. 1993.

Watanabe, H., et al., "Phase–Shifting Lithography: Maskmaking and its Application", J. Vac. Sci. Technol. B, vol. 11, No. 6, pp. 269–2674, Nov./Dec. 1993.

Waas, T., et al., "Automatic Generation of Phase Shift Mask Layouts", Microelectronic Engineering, vol. 34, pp. 139–142 (1994).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proprosal for Pattern Layout Rule in Application of Alternating Phase Shift Mask", SPIE, vol. 3096, pp. 362–374 (1997).

Tsujimoto, E., et al., "Hierachical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchial Processing of Levenson––Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Petersen, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun. 2000.

Pierrat, C., "Investigation of Proximity Effects in Alternating Aperture Phase Shifting Masks", Numerical Technologies, Inc. (11 pages).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 3646, pp. 1–9 (2001).

Ackmann, P. et al., "Phase Shifting And Optical Proximity Corrections To Improve CD Control On Logic Devices In Manufacturing For Sub 0.35 $\mu$m I–Line", Advance Micro Devices (8 pages).

Asai, S. et al., "High Performance Optical Lithography Using A Separated Light Source", J. Vac. Sci. Technol. B, vol. 10, No. 6, pp. 3023–3026, Nov./Dec. 1992.

Barouch, E. et al., "OPTIMASK: An OPC Algorithm For Chrome And Phase–Shift Mask Design", SPIE, vol. 2440, pp. 192–206, Feb. 1995.

Brunner, T. et al., "170nm Gates Fabricated By Phase–Shift Mask And Top Anti–Reflector Process", SPIE, Optical/Laser Microlithography VI, vol. 1927, pp. 182–189 (1993).

Brunner, T., "Rim Phase–Shift Mask Combined With Off–Axis Illumination: A Path To 0.5$\lambda$/Numerical Aperture Geometries", Optical Engineering, vol. 32, No. 10, pp. 2337–2343, Oct. 1993.

Fukuda, H. et al., "Determination Of High–Order Lens Aberration Using Phase/Amplitude Linear Algebra", J. Vac. Sci. Technol. B, vol. 17, No. 6, pp. 3318–3321, Nov./Dec. 1999.

Fukuda, H., "Node–Connection/Quantum Phase–Shifting Mask: Path To Below 0.3 $\mu$m Pitch, Proximity Effect Free, Random Interconnects And Memory Patterning", J. Vac. Sci. Technol. B, vol. 17, No. 6, pp. 3291–3295, Nov./Dec. 1999.

Galan, G. et al., "Application Of Alternating–Type Phase Shift Mask To Polysilicon Level For Random Logic Circuits", Jpn. J. Appl. Phys., vol. 33, pp. 6779–6784 (1994).

Inokuchi, K. et al., "Sub–Quarter Micron Gate Fabrication Process Using Phase–Shifting–Mask For Microwave GaAs Devices", Extended Abstracts of the 1991 Intl. Conference on Solid State Devices and Materials, Yokohama, Japan, pp. 92–94 (1991).

Inokuchi, K. et al., "Sub–Quarter–Micron Gate Fabrication Process Using Phase–Shifting Mask For Microwave GaAs Devices", *Japanese Journal of Applied Physics*, vol. 30, No. 12B, pp. 3818–3821, Dec. 1991.

Ishiwata, N. et al., "Novel Alternating Phase Shift Mask With Improved Phase Accuracy", *SPIE*, Proceedings of the 17$^{th}$ Annual Symposium on Photomask Technology and Management, vol. 3236, pp. 243–246 (1997).

Jinbo, H. et al., "0.2 μm Or Less i–Line Lithography By Phase–Shifting–Mask Technology", *IEEE*, pp. 33.3.1–33.3.4 (1990).

Jinbo, H. et al., "Application Of Blind Method To Phase–Shifting Lithography", *IEEE*, 1992 Symposium on VLSI Technology Digest of Technical Papers, pp. 112–113 (1992).

Jinbo, H. et al., "Improvement Of Phase–Shifter Edge Line Mask Method", *Japanese Journal of Applied Physics*, vol. 30, No. 11B, pp. 2998–3003, Nov. 1991.

Karklin, L., "A Comprehensive Simulation Study Of The Photomask Defects Printability", *SPIE*, vol. 2621, pp. 490–504 (1995).

Kimura, T. et al., "Subhalf–Micron Gate GaAs Mesfet Process Using Phase–Shifting–Mask Technology", *IEEE*, GaAs IC Symposium, pp. 281–284 (1991).

Levenson, M. et al., "Improving Resolution In Photolithography With A Phase–Shifting Mask", *IEEE* Transactions on Electron Devices, vol. ED–29, No. 12, pp. 1828–1836, Dec. 1982.

Lin, B.J., "Phase–Shifting Masks Gain An Edge", *IEEE* Circuits & Devices, pp. 28–35, Mar. 1993.

Liu, H.Y. et al., "Fabrication of 0.1 μm T–Shaped Gates By Phase–Shifting Optical Lithography", *SPIE*, Optical/Laser Microlithography VI, vol. 1927, pp. 42–52 (1993).

Matsuoka, K. et al., "Application Of Alternating Phase–Shifting Mask To 0.16 PLUS CODE 83 IS NOT DEFINEDm CMOS Logic Gate Patterns", Matsushita Electric Ind. Co., Ltd. (9 pages).

Mizuno, F. et al., "Practical Phase–Shifting Mask Technology For 0.3 μm Large Scale Integrations", *J. Vac. Sci. Technol. B*, vol. 12, No. 6, pp. 3799–3803, Nov./Dec. 1994.

Morimoto, H. et al., "Next Generation Mask Strategy—Technologies Are Ready For Mass Production Of 256MDRAM?", *SPIE*, vol. 3236, pp. 188–189 (1997).

Neureuther, A., "Modeling Phase Shifting Masks", *SPIE*, 10$^{th}$ Annual Symposium on Microlithography, vol. 1496, pp. 80–85 (1990).

Nistler, J. et al., "Large Area Optical Design Rule Checker For Logic PSM Application", *SPIE*, Photomask and X–Ray Mask Technology, vol. 2254, pp. 78–92 (1994).

Nistler, J. et al., "Phase Shift Mask Defect Printability Analysis", Proceedings of the Microlithography Seminar INTERFACE '93, OCG MIcroelectronic Materials, Inc., pp. 11–28 (1993).

Ohtsuka, H. et al., "Phase Defect Repair Method For Alternating Phase Shift Masks Conjugate Twin–Shifter Method", *Jpn. J. Appl. Phys.*, vol. 31, pp. 4143–4149 (1992).

Pati, Y.C. et al., "Phase–Shifting Masks For Microlithography: Automated Design And Mask Requirements", *J. Opt. Soc. Am.*, vol. 11, No. 9, pp. 2438–2452, Sep. 1994.

Pierrat, C. et al., "A Rule–Based Approach To E–Beam And Process–Induced Proximity Effect Correction For Phase–Shifting Mask Fabrication", *SPIE*, vol. 2194, pp. 298–309 (1994).

Pierrat, C. et al., "Phase–Shifting Mask Topography Effects On Lithographic Image Quality", *IEEE*, pp. 3.3.1–3.3.4 (1992).

Rieger, M. et al., "System For Lithography Proximity Compensation", Precim Company, Portland, Oregon, Sep. 1993 (28 pages).

Roman, B. et al., "Implications Of Device Processing On Photomask CD Requirements", *SPIE*, vol. 3236 (1997) (Abstract Only).

Spence, C. et al., "Automated Determination Of CAD Layout Failures Through Focus: Experiment And Simulation", *SPIE*, vol. 2197, pp. 302–313 (1994).

Spence, C. et al., "Detection Of 60° Phase Defects On Alternating PSMs", Advance Micro Devices, KLA–Tencor, DuPont RTC (2 pages).

Spence, C. et al., "Integration Of Optical Proximity Correction Strategies In Strong Phase Shifters Design For Poly–Gate Layers", *Bacus News*, vol. 15, Issue 12, pp. 1, 4–13, Dec. 1999.

Stirniman, J. et al., "Wafer Proximity Correction And Its Impace On Mask–Making", *Bacus News*, vol. 10, Issue 1, pp. 1, 3–7, Jan. 1994.

Sugawara, M. et al., "Defect Printability Study Of Attenuated Phase–Shifting Masks For Specifying Inspection Sensitivity", Semiconductor Company, Sony Corporation, Kanagawa, Japan (16 pages).

Terasawa, T. et al., "0.3–Micron Optical Lithography Using A Phase–Shifting Mask", *SPIE*, Optical/Laser Microlithography II, vol. 1088, pp. 25–33, Mar. 1989.

Watanabe, H. et al., "Detection And Printability Of Shifter Defects In Phase–Shifting Masks II Defocus Characteristics", *Jpn. J. Appl. Phys.*, vol. 31, pp. 4155–4160 (1992).

Wiley, J. et al., "Phase Shift Mask Pattern Accuracy Requirements And Inspection Technology", *SPIE*, Integrated Circuit Metrology, Inspection, and Process Control V, vol. 1464, pp. 346–355 (1991).

\* cited by examiner

BLANK FOR ALTERNATING PSM PHOTOMASK WITH CHARGE DISSIPATION LAYER

BACKGROUND OF THE INVENTION

1. Field of the Invention

The present invention relates to a technique for producing a high-resolution phase-shift masking photomask, and is specifically directed towards enabling the use of an electron beam exposure tool to perform the phase level patterning operation during the mask-making process.

2. Related Art

Photomasks are a key element in the manufacture of modern integrated circuits (ICs). During lithography process steps, photomasks are used to transfer an IC layout onto a wafer surface. Each photomask typically comprises a pattern etched into a pattern layer (typically chrome) on a quartz substrate, the pattern representing one layer of the IC. Accordingly, the accuracy of the projected images formed by the photomask strongly affects the performance of the final IC.

During a lithography process step, exposure radiation (light) is used to project the pattern in the chrome layer of a photomask onto a wafer. The chrome layer pattern comprises a multitude of tiny apertures in the chrome layer. As the dimensions of modern IC devices continue to shrink, the chrome apertures must become smaller and smaller, which leads to increasing diffraction of the exposure radiation as it passes through the photomask. This diffraction can cause projected images from adjacent apertures in the chrome layer to overlap and merge, preventing the desired pattern from properly resolving at the wafer surface. Various techniques have been developed in an effort to extend the usable range of optical lithography tools. One of the most important of those techniques is phase-shift masking (PSM) technology.

In a PSM photomask, critical features are defined using pairs of complementary features (apertures) in the chrome layer. The complementary features are configured such that the exposure radiation transmitted by one aperture is 180 degrees out of phase with the exposure radiation transmitted by the other aperture. Therefore, rather than constructively interfering and merging into a single image, the projected images destructively interfere where their edges overlap, creating a clear separation between the two images. As a result, the images formed by a PSM photomask can have a much higher resolution than images formed by a conventional photomask.

To shift the phase of the exposure radiation passing through a given aperture in the chrome layer, a pocket is etched in the quartz substrate at that aperture. The quartz pocket reduces the thickness of the quartz substrate at the out-of-phase ("phased") aperture relative to the quartz substrate thickness at the in-phase aperture. The pocket depth at the phased aperture depends on the wavelength of the exposure radiation used by the lithography tool in which the PSM photomask is to be used. By precisely configuring the relative thickness of the quartz substrate at the phased and in-phase regions, the projected images from adjacent apertures can be set to be 180 degrees out of phase.

FIGS. 1A–1F depict a conventional process for creating a PSM photomask. FIG. 1A shows a conventional photomask blank 110 comprising an original resist layer 113 formed over a chrome layer 112, which is in turn formed over a quartz substrate 111. During a primary patterning operation, an electron beam ("e-beam") scanner exposes regions 113a and 113b of original resist layer 113. Exposed regions 113a and 113b are developed away, leaving patterned resist layer 113 shown in FIG. 1B. An etch process is then performed, thereby transferring the pattern in original resist layer 113 into chrome layer 112. Original resist layer 113 is then stripped away, leaving patterned chrome layer 112 with apertures 112a and 112b, as shown in FIG. 1C.

At this stage, the entire layout pattern is contained in chrome layer 112. However, to complete the PSM photomask, quartz substrate 111 must be etched to the proper depth under the out-of-phase, or "phased", portion of the layout pattern. As shown in FIG. 1D, a secondary resist layer 140 is formed over patterned chrome layer 112, and a portion 140a of secondary resist layer 140 is optically exposed during a "phase level patterning" operation. Exposed portion 140a is developed away, and chrome layer 112 is etched through, as shown in FIG. 1E. Thus, the actual etching of quartz substrate 111 is controlled by aperture 112b in chrome layer 112, i.e., the purpose of the phase level patterning operation is merely to uncover the appropriate apertures in chrome layer 112. After the quartz etch, secondary resist layer 140 is stripped, leaving a basic PSM photomask 110f as shown in FIG. 1F.

Once the quartz etch is complete, apertures 112a and 112b are complementary apertures, as the images projected by the two during a lithography process step will be 180 degrees out of phase with each other. Aperture 112a is designated the in-phase aperture, whereas aperture 112b is designated the phased aperture. The phase shift of aperture 112b is provided by a pocket 111b that thins quartz substrate 111 under aperture 112b. While only a single complementary pair of apertures is depicted, any number could be present in an actual PSM photomask, each of the phased apertures having a quartz pocket of depth d.

In this manner, basic PSM photomask 110f is configured to produce properly phase-adjusted images at the wafer surface. However, the pockets formed by the quartz etch affect not only the phase, but also the intensity, of the exposure radiation transmitted by the PSM photomask. FIG. 2 shows how PSM photomask 110f would be used in a lithography process step. PSM photomask 110f of is placed "upside down" (i.e. with quartz substrate 111 on top) in a stepper (not shown), and exposure radiation from the stepper projects the pattern in chrome layer 112 onto a wafer (also not shown). As indicated in FIG. 2, diffraction of the exposure radiation at phase layer aperture A1 starts to occur at the base of pocket 111b, whereas diffraction at chrome aperture A2 originates at the surface of quartz substrate 111 (i.e. where aperture A2 meets quartz substrate 111). Therefore, more of the exposure radiation is "lost" inside quartz substrate 111 at phase layer aperture A1, resulting in unequally-sized and improperly-spaced projected features. This phenomenon is described in detail in "Phase-Shifting Mask Topography Effects on Lithographic Image Quality" by Pierrat et al., IEDM 92-53, IEEE 1992, herein incorporated by reference.

To overcome this problem, a post-processing step is typically performed on a PSM photomask after the phase layer quartz etch. The purpose of the post-processing step is to create an "undercut" beneath the chrome layer by increasing the width of the quartz pockets under the phased apertures. This undercutting process is typically accomplished by performing a wet (isotropic) etch on the quartz layer. For example, after the dry (anisotropic) etch shown in FIG. 1E, quartz substrate 111 could be wet etched, as shown in FIG. 1G (the dry etch depth would have to be reduced to maintain the final phase-shifting characteristics of the quartz after the wet etch). The wet etch gives the pocket in quartz substrate 111 a final width W1, which is greater than the width W2 of the aperture in chrome layer 112, as shown in FIG. 1H. The diffraction effects from the base of the pocket in the quartz substrate then have much less effect on the actual radiation transmitted by the aperture in the quartz layer. This in turn allows the intensity characteristics of the radiation output from the phase layer aperture to more closely match the characteristics of the output from the chrome aperture, thereby resulting in improved PSM functionality.

This post-processing step can be performed in various ways. For example, after a dry etch of the quartz substrate to form the phase layer (as shown in FIGS. 1E–1F), a wet etch could be performed on both the phase and pattern layers, as shown in FIG. 1I. This would produce a chrome layer overlap at all apertures in chrome layer 112, as shown in FIG. 1J, enhancing the similarity of the transmitted radiation intensities from those apertures. Alternatively, after a dry etch of the quartz substrate to form the phase layer (as shown in FIGS. 1E–1F), a second dry etch could be performed on both the phase and pattern layers, as shown in FIG. 1K, to extend the quartz pockets beneath all apertures in chrome layer 112, as shown in FIG. 1L. A wet etch could then be performed on all those quartz pockets to create the desired chrome layer overlap, as shown in FIG. 1M. Because the absolute difference between quartz substrate thicknesses at both the phase and pattern layers remains unchanged, the relative phase of transmitted light from both regions remains the same. At the same time, because the relative difference between the phase layer and pattern layer quartz cavity depths is reduced (i.e. the ratio between the depths moves closer to one) the similarity of the transmitted radiation intensity is enhanced.

As noted previously in describing FIG. 1D, optical exposure tools are typically used to expose the portions of the PSM photomask to be etched to form the phase layer. Optical exposure tools are generally less precise than e-beam exposure tools (i.e., have a lower resolution and produce greater corner rounding in exposed images), but have been acceptable for this secondary, or "phase level" patterning operation because the actual phase level etch is governed by the existing apertures in the chrome layer. The patterning operation must merely be precise enough to uncover the relevant chrome apertures. However, as modern device geometries continue to shrink, optical tools can no longer accurately uncover the smaller chrome apertures. For example, the round-cornered features produced by optical exposure tools during phase level patterning operation may "trim" the sharp corners of the chrome layer features formed by an e-beam exposure tool. The subsequent quartz etch to form the phase layer would not etch those corners, adversely affecting the final performance of the PSM photomask. Therefore, it is desirable to be able to use e-beam exposure tools for the phase level patterning operation.

Unfortunately, conventional PSM photomask production techniques cannot readily incorporate an e-beam process for phase level patterning. As the e-beam tool scans across the portions of the resist to be exposed, electrons penetrate into the resist layer. If allowed to accumulate, these embedded electrons can deflect the path of the e-beam, thereby resulting in targeting errors. This "charging problem" does not arise during the primary patterning operation (i.e., the resist patterning prior to chrome etch), because of the continuous chrome layer under the original resist layer. Specifically, because the chrome layer typically has an external connection to ground during the patterning operation, the chrome layer provides an electrical conduction path that serves to dissipate any charge buildup in the resist layer.

However, during the phase level patterning operation, the chrome layer is no longer continuous. At each aperture in the chrome layer, the secondary resist layer is formed directly on the non-conducting quartz substrate. Consequently, charge buildup in the secondary resist layer at the chrome aperture locations has no dissipation path. This charging issue is especially problematic because the chrome aperture locations are precisely the regions that need to be exposed during the phase level patterning operation. This problem is illustrated in FIG. 3, which depicts the phase level patterning operation shown in FIG. 1D, but with an e-beam exposure process rather than an optical exposure process. As shown in FIG. 3, as the e-beam scans across a target region 140b of resist layer 140, charges (i.e. electrons) build up in the resist. Because target region 140b overlies chrome aperture 112b, and is actually contacting non-conducting quartz substrate 111, there is no dissipation path for the electrons in target region 140b. Therefore, a local charge develops that can eventually deflect the incoming e-beam off its intended path, and thus lead to inaccurate patterning of resist layer 140.

Conventional attempts to overcome this charging issue incorporate the temporary addition of a conductive layer over the secondary resist layer. FIGS. 4A–4D show a method that can be used to enable the use of an e-beam tool to perform the phase level patterning operation. FIG. 4A shows a patterned chrome layer 412 on a quartz substrate 411. Chrome layer 412 includes apertures 412a and 412b, formed in previous process steps substantially similar to those described in relation to FIGS. 1A–1C. A secondary resist layer 440 is formed over chrome layer 412, and a temporary conductive layer 450, such as a metal layer or conductive polymer layer, is deposited over secondary resist layer 440. Conductive layer 450 can be penetrated by the e-beam, and so does not interfere with the exposure of secondary resist layer 440 during the patterning operation. At the same time, conductive layer 450 provides a charge dissipation path for any electron buildup in secondary resist layer 440, thereby preventing localized effects on e-beam targeting. Therefore, the e-beam tool can accurately expose a desired portion 440a of secondary resist layer 440.

After the exposure step, conductive layer 450 must be removed using an appropriate process (e.g., an etch process for a metal layer, a solvent strip process for a conductive polymer), as shown in FIG. 4B. Once conductive layer 450 is removed, exposed portion 440a of secondary resist layer 440 can be developed away, uncovering phased aperture 412b but leaving in-phase aperture 412a covered, as shown in FIG. 4C. A quartz etch process can then be performed to create a quartz pocket 411b under aperture 412b, after which secondary resist layer can be stripped, leaving in-phase aperture 412a and phased aperture 412b properly configured, as shown in FIG. 4D. Of course, a post-processing wet etch step could then be performed to improve PSM performance.

While the aforementioned process does allow the more accurate e-beam exposure tool to be used for the phase level patterning operation, additional conductive layer formation and removal steps are required. This undesirably adds both cost and complexity to the mask making process. In addition, the process can be further complicated if a barrier layer is required between secondary resist layer 440 and temporary conductive layer 450 to prevent interactions between the two layers during formation or removal of conductive layer 450. Accordingly, it is desirable to provide a method for efficiently producing a PSM photomask that permits e-beam tool usage during the phase level patterning operation without introducing additional process steps.

SUMMARY

The present invention provides a method for producing a PSM photomask that allows the use of an e-beam exposure tool during the phase level (secondary) patterning process, thereby enabling higher precision patterning than is available with optical exposure tools. The invention avoids the secondary resist layer charging problem typically associated with e-beam exposure tools by providing a conductive layer on the quartz surface that dissipates any charge buildup during phase level patterning.

A method for producing a PSM photomask in accordance with an embodiment of the invention incorporates a photomask blank that includes an extra conductive layer between the chrome (pattern) layer and the quartz substrate. Such blanks are sometimes used as calibration blanks to measure pattern placement errors in e-beam exposure tools, but are not used as photomask blanks (i.e., are not used to produce actual photomasks). The added conductive layer is typically opaque, and must be removed at the apertures patterned into the chrome layer—an undesirable extra step in conventional mask making processes.

According to an embodiment of the invention, the resist layer of a conductive mask blank is patterned using an e-beam exposure tool with the in-phase and phased features of an IC layout. The pattern is then etched into the chrome layer, leaving the conductive layer intact. A second resist layer is formed over the patterned chrome layer, and is patterned to uncover the phased features in the chrome layer. This phase level (secondary) patterning operation is performed using an e-beam exposure tool, since the continuous conductive layer provides a charge drainage path for any electron buildup in the second resist layer. As noted previously, an e-beam tool advantageously provides more accurate patterning than an optical exposure tool.

After the phase level patterning operation, an anisotropic etch etches through the conductive layer and creates pockets in the quartz substrate under each phased feature in the chrome layer. The depth of this "phase level etch" is dependent on the wavelength of the exposure radiation, the index of refraction of the quartz substrate, and the relative etch rates of the conductive layer and quartz substrate. By etching to the proper depth at this stage, proper PSM functionality will be provided by the final photomask.

After the anisotropic etch, the second resist layer is stripped, and an isotropic etch is performed through both the in-phase and phased features in the chrome layer to complete the PSM photomask. As noted previously, the purpose of this anisotropic etch step is to undercut the features in the chrome layer to reduce diffraction-induced intensity variations in the images projected by the final mask. However, this "post-processing" step also eliminates any problems associated with the opacity of the conductive layer. Because the isotropic etch removes the conductive layer at the in-phase features in the chrome layer, and because the previous anisotropic etch removed the conductive layer at the phased features, the conductive layer is completely removed from the path of the exposure radiation through the photomask.

According to another embodiment of the invention, an anisotropic etch can be performed through both in-phase and phased features in the chrome layer after the phase level etch. A subsequent isotropic etch provides the desired undercutting at the features in the chrome layer. The additional anisotropic etch results in reduced quartz substrate thickness at both the in-phase and phased chrome features, thereby enhancing equalization of transmitted radiation intensity.

According to another embodiment of the invention, a blank having a "visually transparent" conductive layer can be used to create a PSM photomask. Indium oxide doped with tin oxide, or "ITO", is transparent at visible wavelengths (i.e., visually transparent), but is opaque to the short wavelength radiation used by mask patterning tools. Display manufacturers often use a layer of ITO in their flat-panel displays to provide electrical routing capability without interfering with the imaging properties of the display. A PSM photomask blank in accordance with an embodiment of the invention could therefore be made with a layer of ITO between the chrome layer and the quartz substrate. By making use of such a blank, the phase level etch can be an isotropic etch, since the conductive layer at the in-phase features in the chrome layer allows good transmission of the exposure radiation used in lithography process steps. Note that the depth of the phase level etch under the phased chrome features must account for any difference in the indices of refraction of the transparent conductive layer material and the quartz substrate.

In this manner, the charging issue associated with conventional PSM photomask-making operations can be overcome. The resultant improved patterning precision is achieved without requiring additional conductive layer formation and removal operations, greatly simplifying the mask making process. Consequently, there is much less chance for defect formation, providing a much more robust process. The present invention will be more fully understood in view of the following description and drawings.

DETAILED DESCRIPTION

FIGS. 5A–5H show a method for creating a PSM photomask in accordance with an embodiment of the invention. By enabling the use of an e-beam tool, rather than an optical exposure tool, during the phase level patterning operation, the invention allows finer PSM patterns to be formed in the PSM photomask.

Figure 1A:
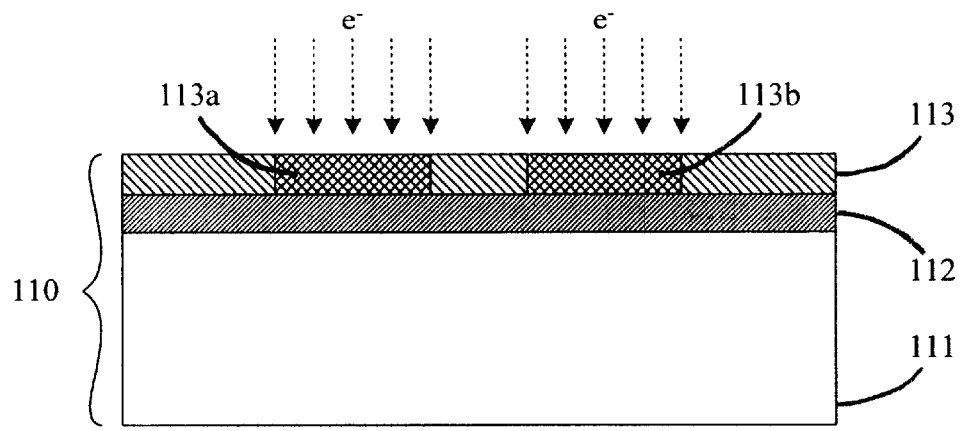
FIGS. 1A–1H diagram a conventional method for producing a PSM photomask.
Figure 1B:
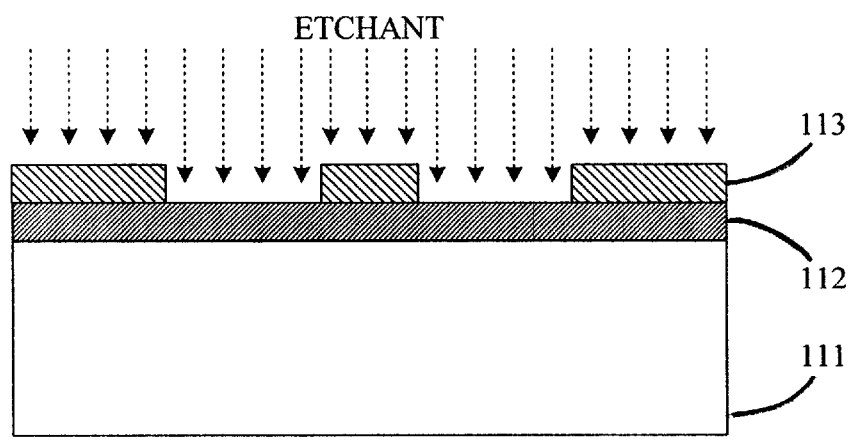
Figure 1C:
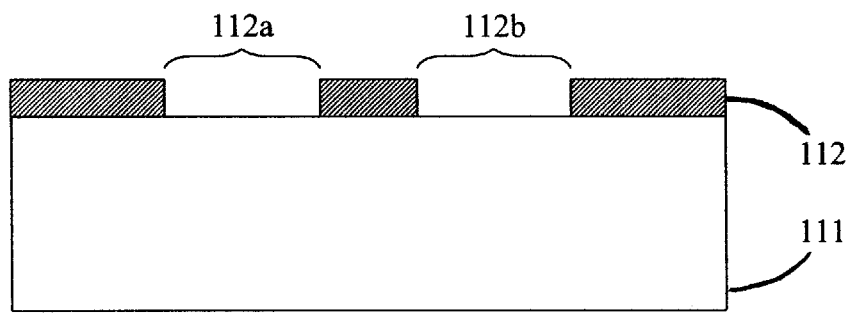
Figure 1D:
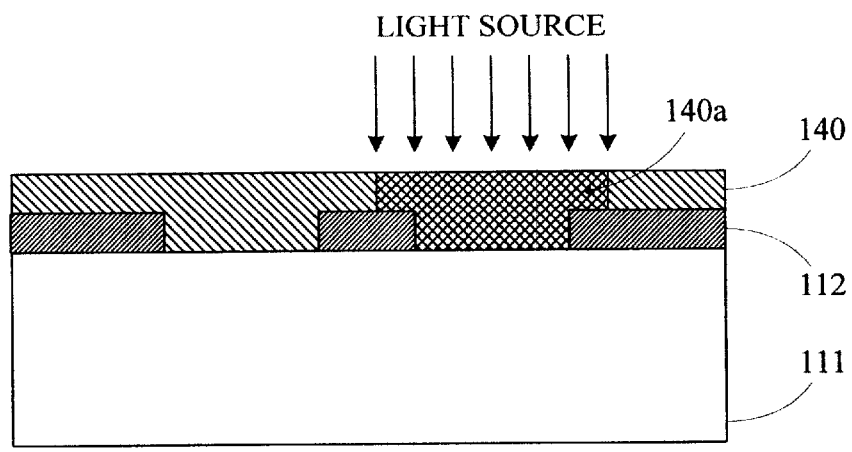
Figure 1E:
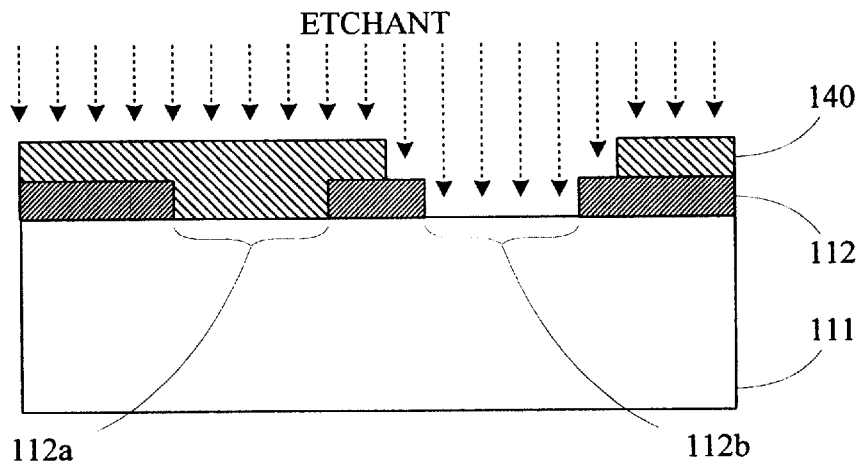
Figure 1F:
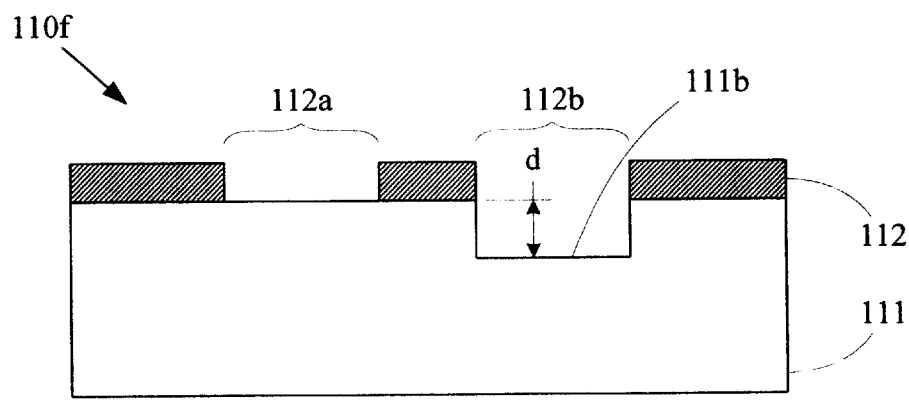
Figure 1G:
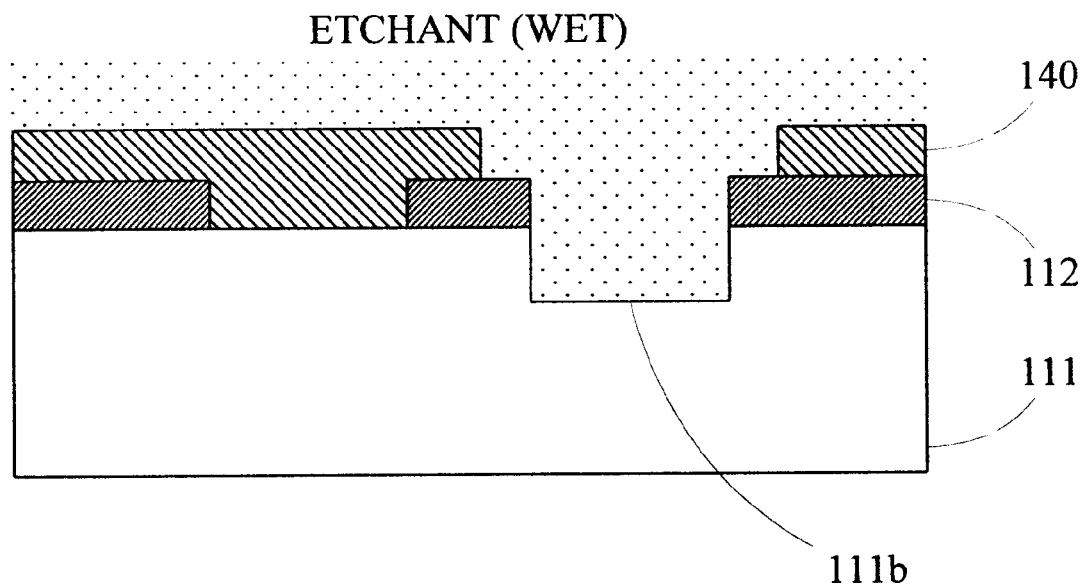
Figure 1H:
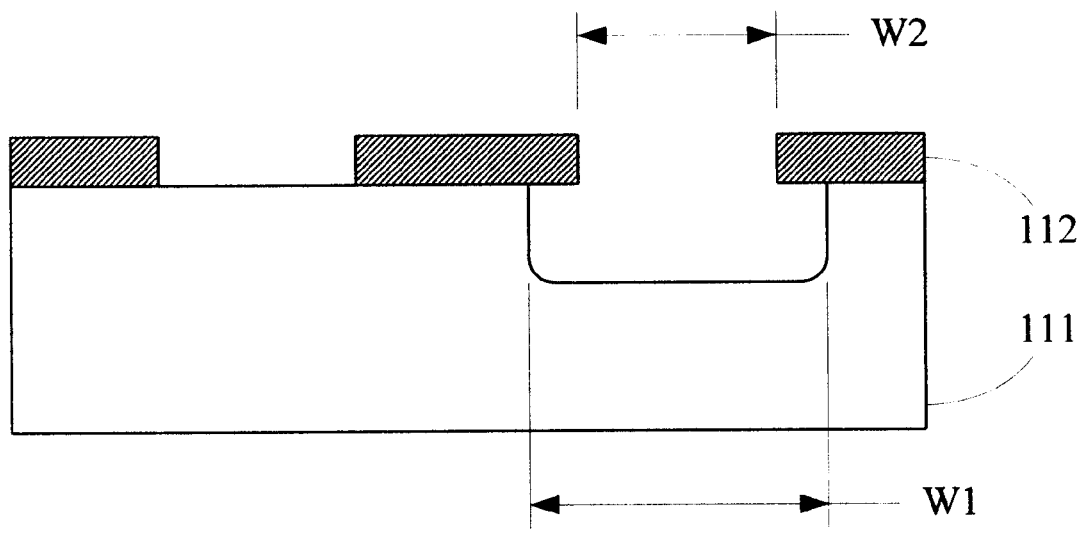
Figure 1I:
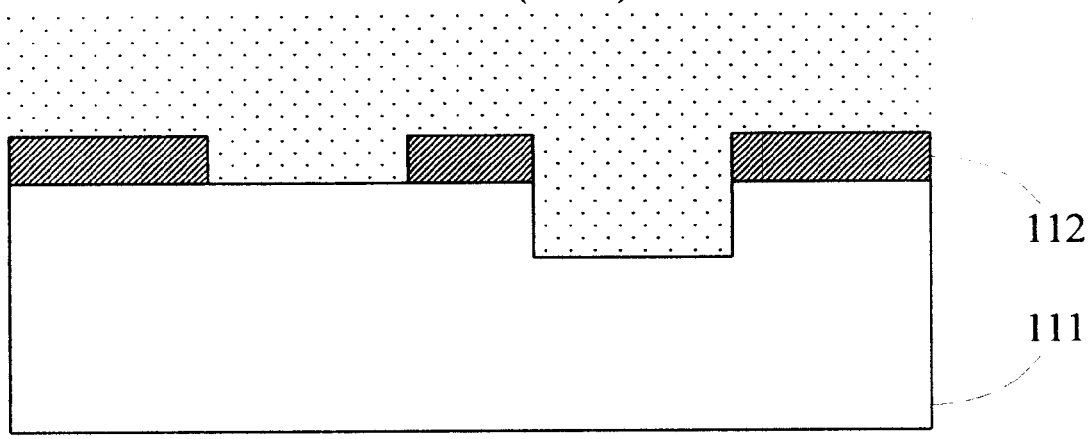
FIGS. 1I–1M diagram an alternative method for producing a PSM photomask.
Figure 1J:
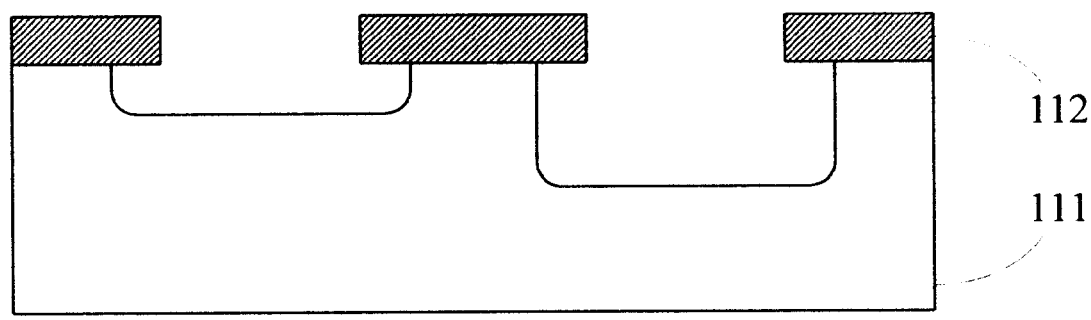
Figure 1K:
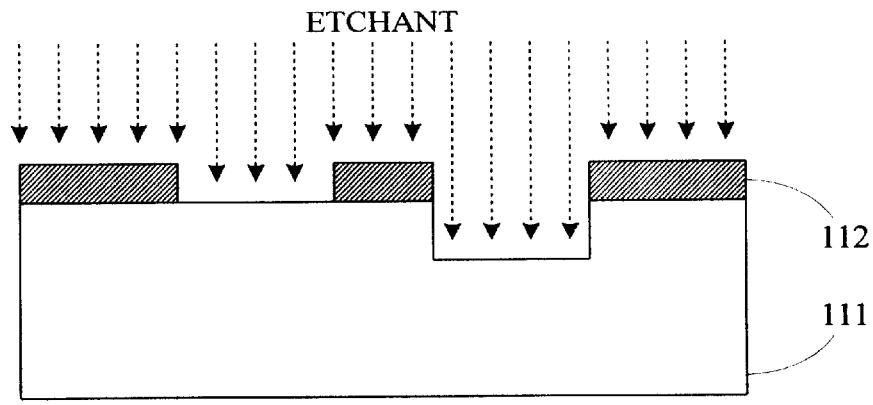
Figure 1L:
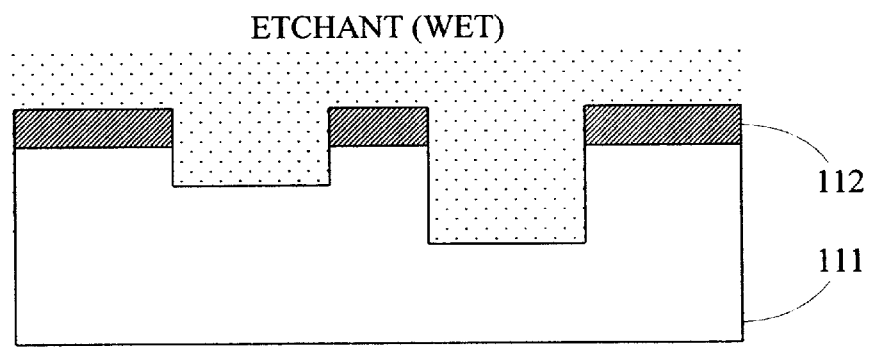
Figure 1M:
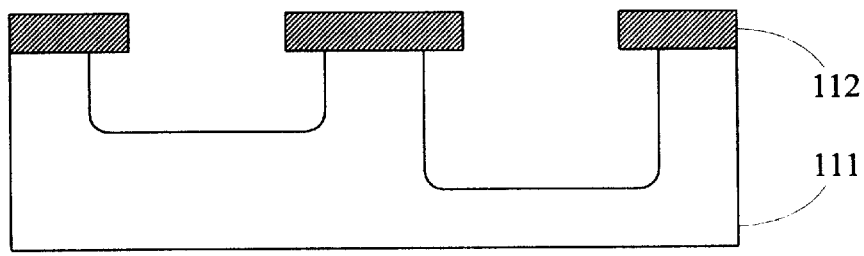
Figure 2:
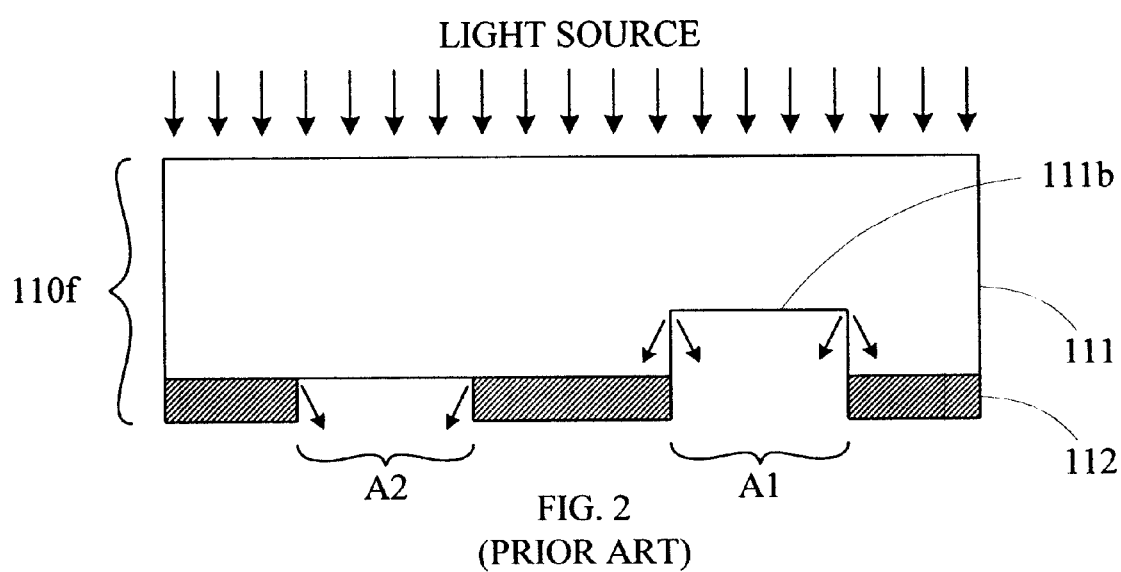
FIG. 2 is a diagram indicating diffraction effects that occur in a PSM photomask during use.
Figure 3:
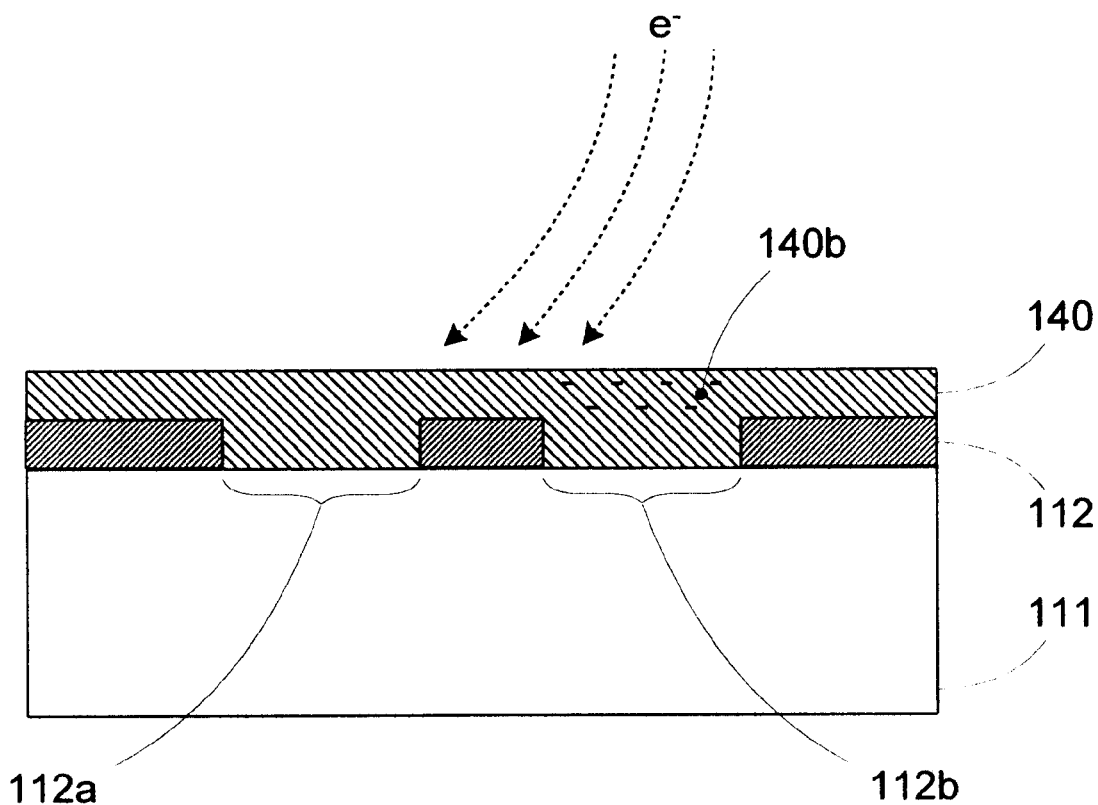
FIG. 3 is a diagram indicating the charging issue associated with the use of e-beam exposure tools in a conventional phase level patterning operation.
Figure 4A:
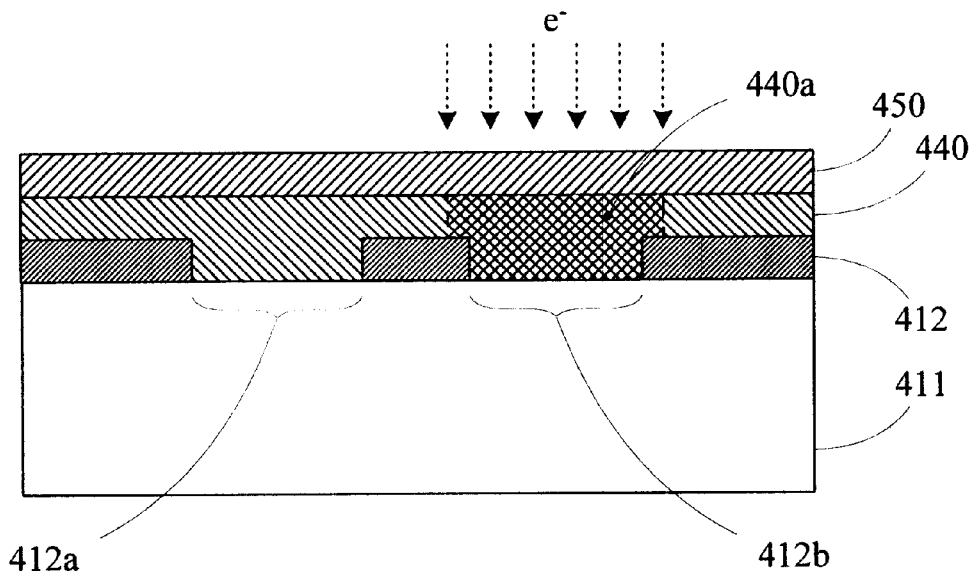
FIGS. 4A–4D demonstrate a conventional workaround to enable the use of e-beam exposure tools for phase level patterning in a PSM photomask-making operation.
Figure 4B:
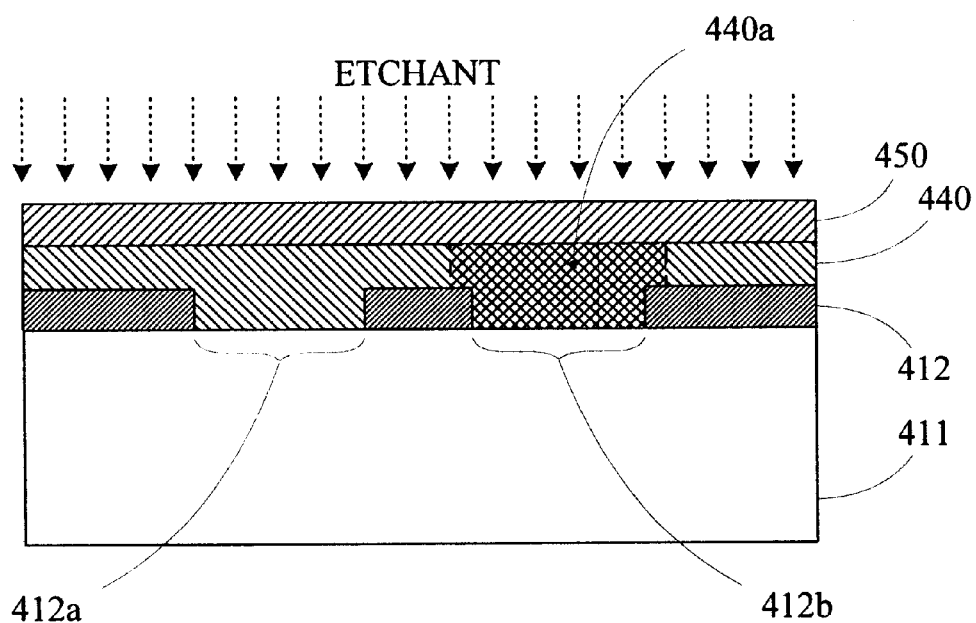
Figure 4C:
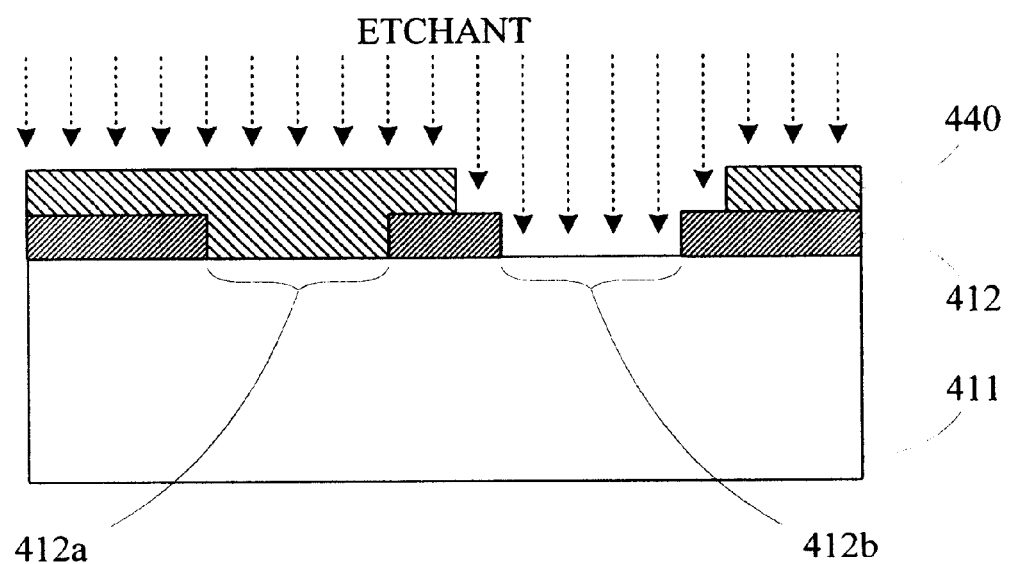
Figure 4D:
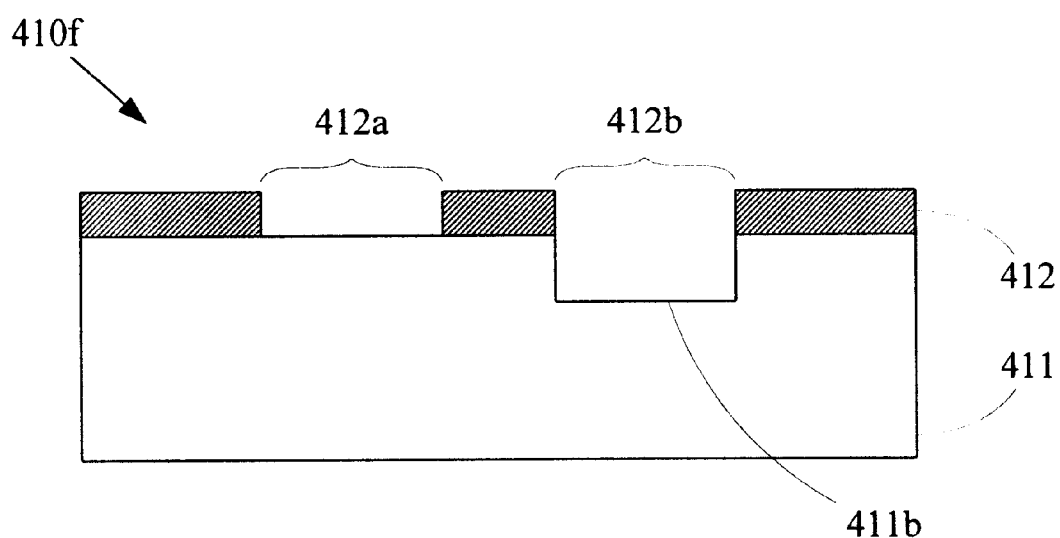
Figure 5A:
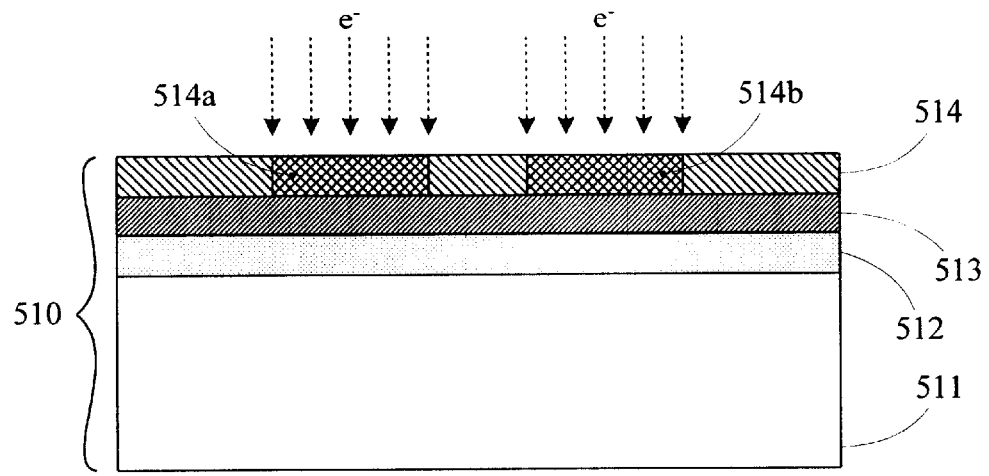
FIGS. 5A–5H diagram a method for producing a PSM photomask using a conductive blank in accordance with an embodiment of the invention.

FIG. 5A shows a primary patterning operation being performed on a conductive blank 510. In accordance with an embodiment of the invention, conductive blank 510 comprises a multilayer structure including an original resist layer 514 formed over a pattern layer 513, and a conductive layer 512 formed between pattern layer 513 and a quartz substrate 511. Pattern layer 513 can comprise any pattern layer material, such as chrome, iron oxide, or various chemical emulsions. Conductive blank 510 differs from conventional photomask blanks because of the inclusion of conductive layer 512, which can comprise any electrically conductive material, including electrically conductive polymers (such as TQV or ESPACER 100) and electrically conductive metal oxides (such as the aforementioned ITO).

Figure 5B:
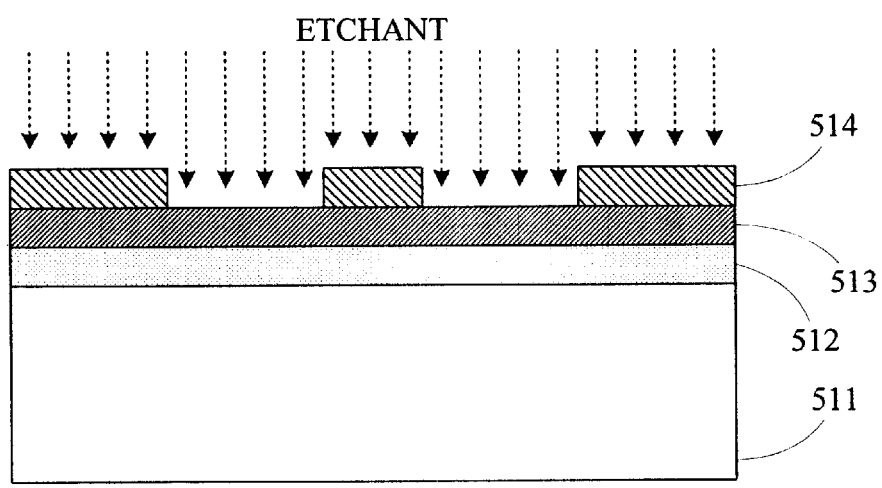

During the primary patterning operation, an e-beam tool exposes regions 514a and 514b of original resist layer 514, which correspond to complimentary PSM features in the final mask pattern. Any charge buildup in original resist layer 514 due to the e-beam exposure process can be dissipated by pattern layer 513. Exposed regions 514a and 514b are developed away, and an etch process is performed on the exposed portions of chrome layer 513, as shown in FIG. 5B. Note that while an anisotropic etch process is indicated in FIG. 5b, an isotropic etch process could also be used.

Figure 5C:
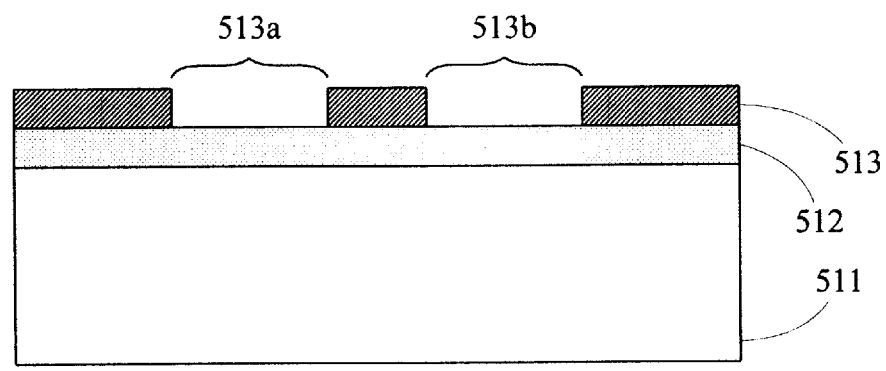

Various endpoint detection methods can be used in this etch process to ensure that conductive layer 512 is left substantially intact. For example, the composition of the plasma in the etch chamber can be monitored, and the etch process stopped when emission wavelengths related to chromium by-products disappear. Alternatively, the reflectivity of the etched surface can be monitored and the etch process stopped when the reflectivity of the conductive layer is detected. In any case, some amount of the conductive layer thickness can be etched away without detriment to the overall process, as long as the conductive properties of the conductive layer are not interrupted (i.e., the conductive layer is not etched all the way through). Original resist layer 514 is then stripped away, thereby leaving patterned pattern layer 513 with apertures 513a and 513b, as shown in FIG. 5C.

Figure 5D:
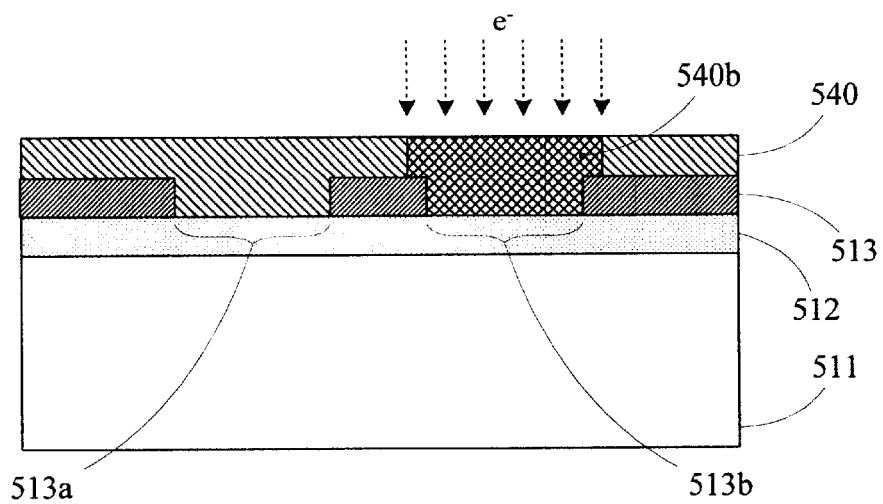
Figure 5E:
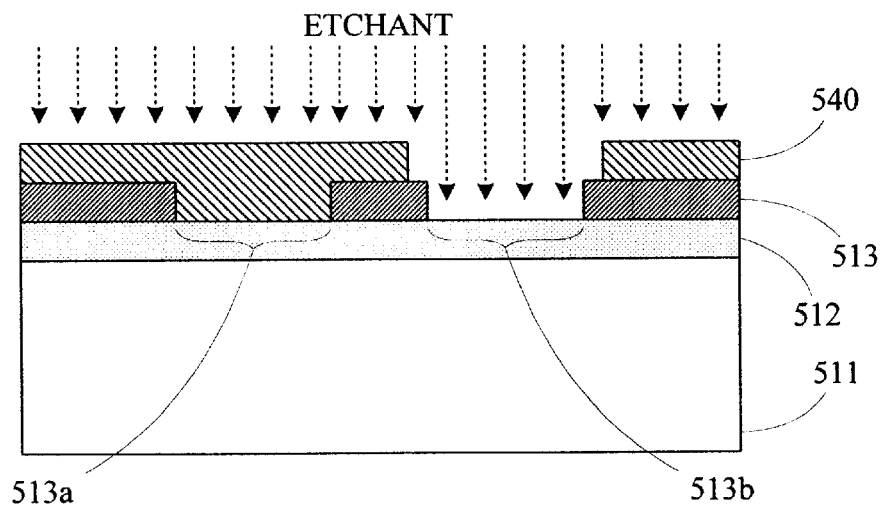

At this stage, the entire layout pattern is contained in chrome layer 513. To complete the PSM photomask, the thickness of quartz substrate 511 must be etched to the proper depth under the out-of-phase ("phased") portions of the layout pattern. A secondary resist layer 540 is therefore deposited over patterned pattern layer 513, as shown in FIG. 5D. A phase level patterning operation is then performed using an e-beam exposure tool, exposing a portion 540b of secondary resist layer 540. Portion 540b overlies a portion of pattern layer 513 including aperture 513b. Any charge buildup in secondary resist layer 540 due to the e-beam exposure process is dissipated by conductive layer 512, ensuring an accurate patterning process.

Next, a dry etch process is performed through exposed aperture 513b in pattern layer 513. The dry etch process is anisotropic and etches through conductive layer 512 and into quartz substrate 511. Note that no etch is perfectly anisotropic, and the anisotropy of conductive layer 512 can be different than that of quartz substrate 511, leading to slightly different undercut widths for the two layers. However, the effect of this etch differential is inconsequential, and would have a minimal effect on the performance of the final PSM photomask. The only requirement on the dry etch process itself is that it have a selectivity to resist (i.e., resist layer 540) and the material of pattern layer 513 (e.g., chrome). The actual etching of conductive layer 512 and quartz substrate 511 is governed by aperture 513b, since the phase level patterning operation simply removes a region of secondary resist layer 540 that surrounds aperture 513b.

Figure 5F:
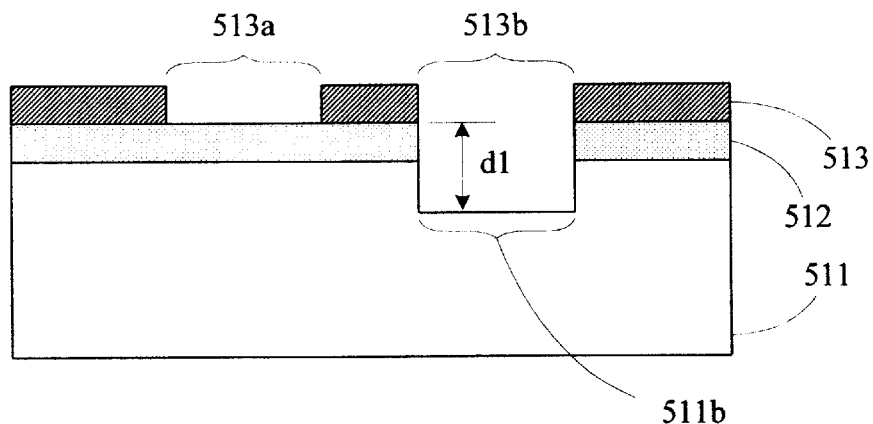
Figure 5G:
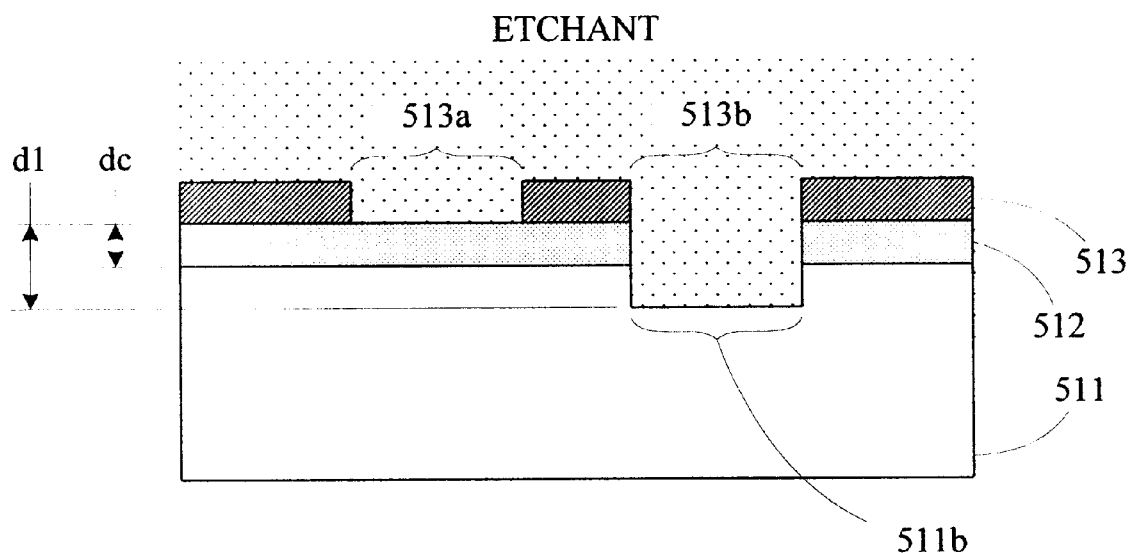
Figure 5H:
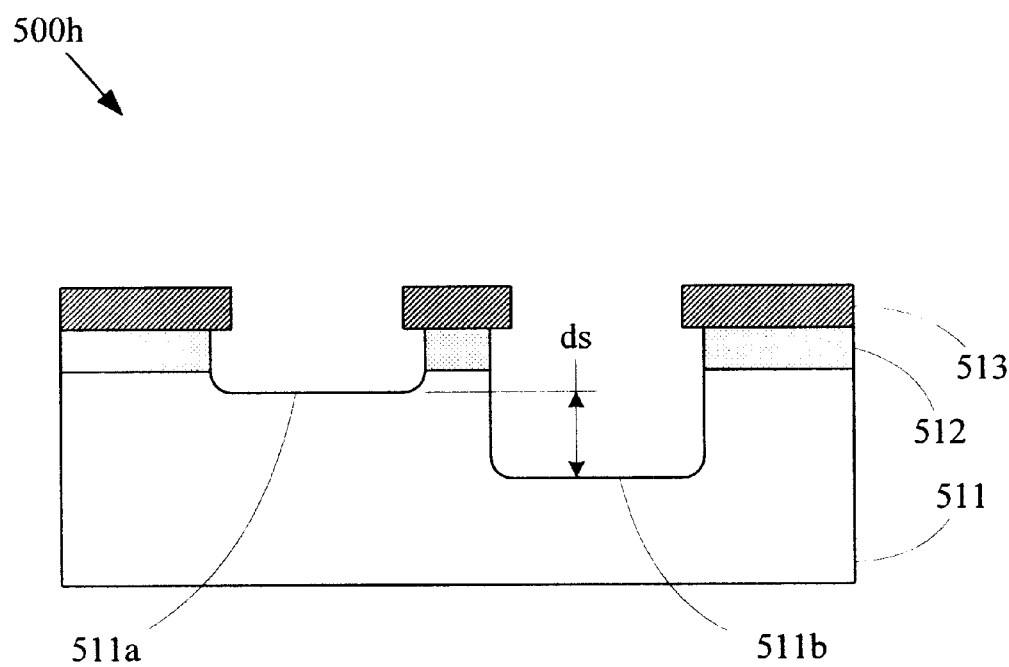

After the dry etch process, which creates a pocket 511b in quartz substrate 511, secondary resist layer 540 is stripped, as shown in FIG. 5F. Quartz pocket 511b is configured to extend a depth d1 below the surface of conductive layer 512. A wet etch is then performed on conductive layer 512 and quartz substrate 511 through apertures 513a and 513b of pattern layer 513 to form a completed PSM photomask 500h, as shown in FIG. 5G. This isotropic etch process etches through conductive layer 512 and into quartz substrate 511 under aperture 513a, thereby undercutting pattern layer 513 in the process. At the same time, the etch deepens and widens the previously etched portions of conductive layer 512 and quartz substrate 511 under aperture 513b.

By widening the etched areas under apertures 513a and 513b (i.e. undercutting pattern layer 513), the wet etch minimizes diffraction-induced intensity variations caused by the different quartz substrate thickness at the in-phase and phased pattern layer apertures. The actual amount of widening would typically be determined empirically, although mathematical models can also be used (generated, for example, by a photolithography simulation program such as TEMPEST, developed by the University of California at Berkeley). The wet etch also sets the final phase transfer characteristics of in-phase aperture 513a and phased aperture 513b, as it etches downward into quartz substrate 511. For the two apertures to project images that are 180 degrees out of phase, the thickness of quartz substrate 511 under apertures 513a and 513b must differ by a "phase shift thickness" ds. Thickness ds is defined according to the equation:

$$ds = \lambda/(2n-1) \qquad [1]$$

where λ is the wavelength of the exposure radiation (light) to be used the PSM photomask and n is the index of refraction of quartz substrate 511 at wavelength λ.

According to a first embodiment of the invention, the etch rate of conductive layer 512 is the same as the etch rate through quartz substrate 511. Therefore, the absolute difference between the etch depth under aperture 513a and the etch depth under aperture 513b remains constant throughout the wet etch process, and the original (dry etch) depth d1 at aperture 513b is equal to phase shift thickness ds.

According to another embodiment of the invention, conductive layer 512 and quartz substrate 511 have different etch rates. In that case, the original depth d1 would be given by the equation:

$$d1 = ds + dc(1 - E2/E1) \qquad [2]$$

where dc is the thickness of conductive layer 512 (see FIG. 5G), E1 is the etch rate of conductive layer 512, and E2 is the etch rate of quartz substrate 511.

In this manner, a high-resolution PSM photomask can be formed using an e-beam exposure tool for the phase level patterning operation. While the formation of only a single pair of complimentary PSM features is shown in FIGS. 5A–5H, it is understood that the technique of the invention can be applied to PSM photomask patterns comprising any number of in-phase and phased features.

Figure 5I:
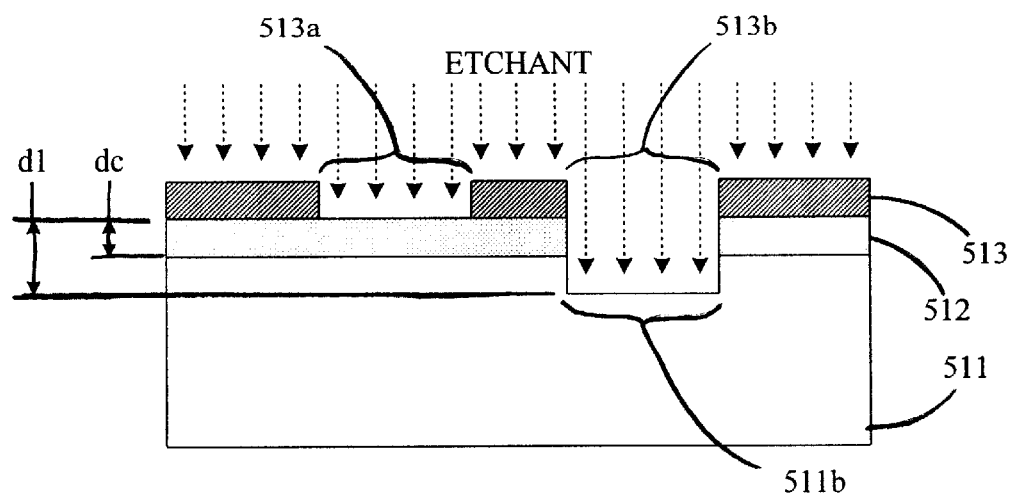
FIGS. 5I–5K diagram a method for producing a PSM photomask using a conductive blank in accordance with another embodiment of the invention.
Figure 5J:
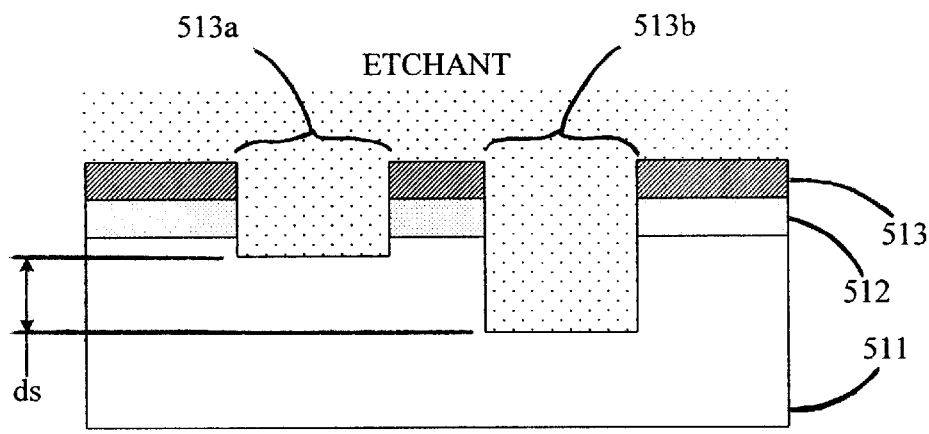
Figure 5K:
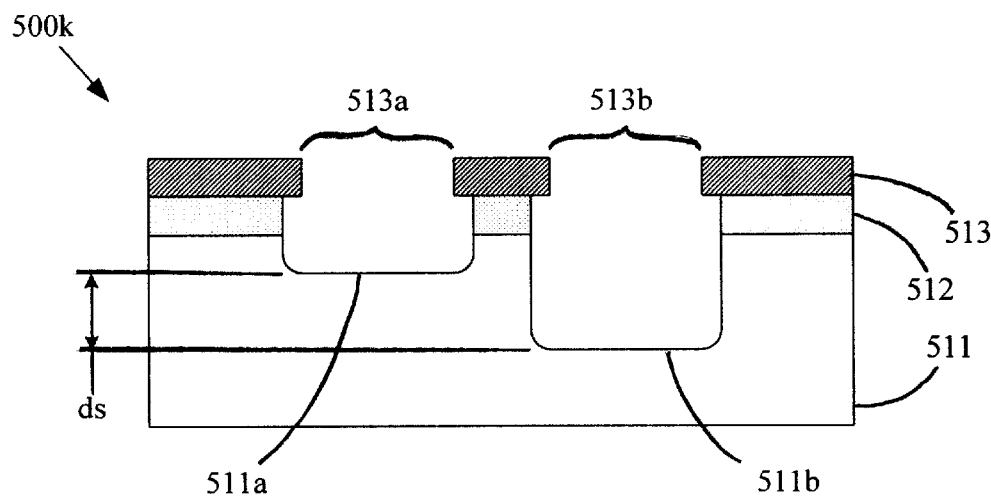

As described previously, exposure radiation intensity matching for the in-phase and phased pattern layer apertures can be enhanced by increasing both the in-phase and phased quartz pocket depths. FIGS. 5I–5K show a method for producing increased quartz pocket depths according to an embodiment of the invention. FIG. 5I shows an intermediate stage in a PSM photomask-making process, wherein pattern layer 513 has been patterned and quartz pocket 511b has been formed in the manner described in relation to FIGS. 5A–5F. However, rather than immediately performing the wet etch shown in FIG. 5G, a second dry etch is performed, this time through both pattern layer apertures 513a and 513b, as shown in FIG. 5I. The process etches through conductive layer 512 and into quartz substrate 511 at aperture 513a, while further etching quartz pocket 511b at aperture 513b, as shown in FIG. 5J.

As with the previously described wet etch, the original depth d1 of the etch at aperture 513b (see FIG. 5I) must be carefully controlled to ensure proper function of the final PSM photomask. According to an embodiment of the invention, the etch rates of conductive layer 512 and quartz substrate 511 are equal, and so depth d1 is equal to the phase shift thickness ds (defined in equation 1). According to another embodiment of the invention, the etch rates of conductive layer 512 and quartz substrate 511 are not the same, and depth dl is defined according to equation 2. In either case, the quartz substrate thickness at apertures 513a and 513b end up differing by phase shift thickness ds after the second dry etch, as shown in FIG. 5J.

A final wet etch is then performed through apertures 513a and 513b to provide the desired chrome layer undercut and produce completed PSM photomask 500k, as shown in FIG. 5K. Because quartz substrate 511 is etched through both apertures 513a and 513b, the absolute difference between the quartz substrate thickness at the two apertures remains constant at phase shift thickness ds. Proper phase-shifting performance is therefore maintained, and exposure radiation intensity matching is enhanced by the increased etch depth and width.

According to another embodiment of the invention, a conductive blank having a visually transparent conductive layer could be used to eliminate one of the dry etch steps in the mask-making process. For example, conductive layer 512 of conductive blank 510 shown in FIG. 5A could be formed from ITO, using known ITO deposition techniques used by flat panel display manufacturers.

Figure 5L:
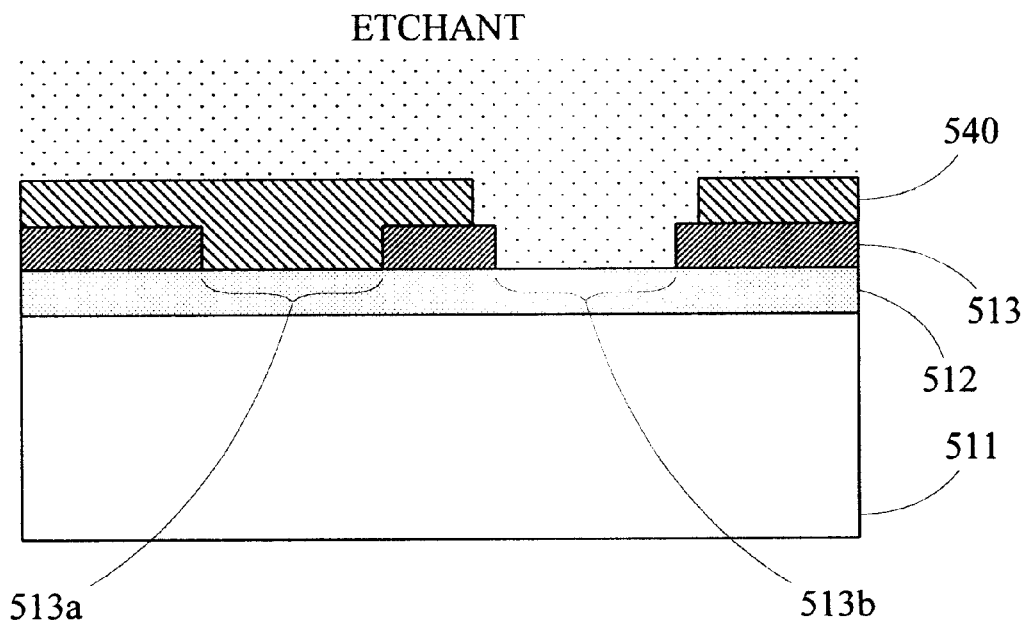
FIGS. 5L–5M diagram a method for producing a PSM photomask using a conductive blank having a visually transparent conductive layer, in accordance with another embodiment of the invention.
Figure 5M:
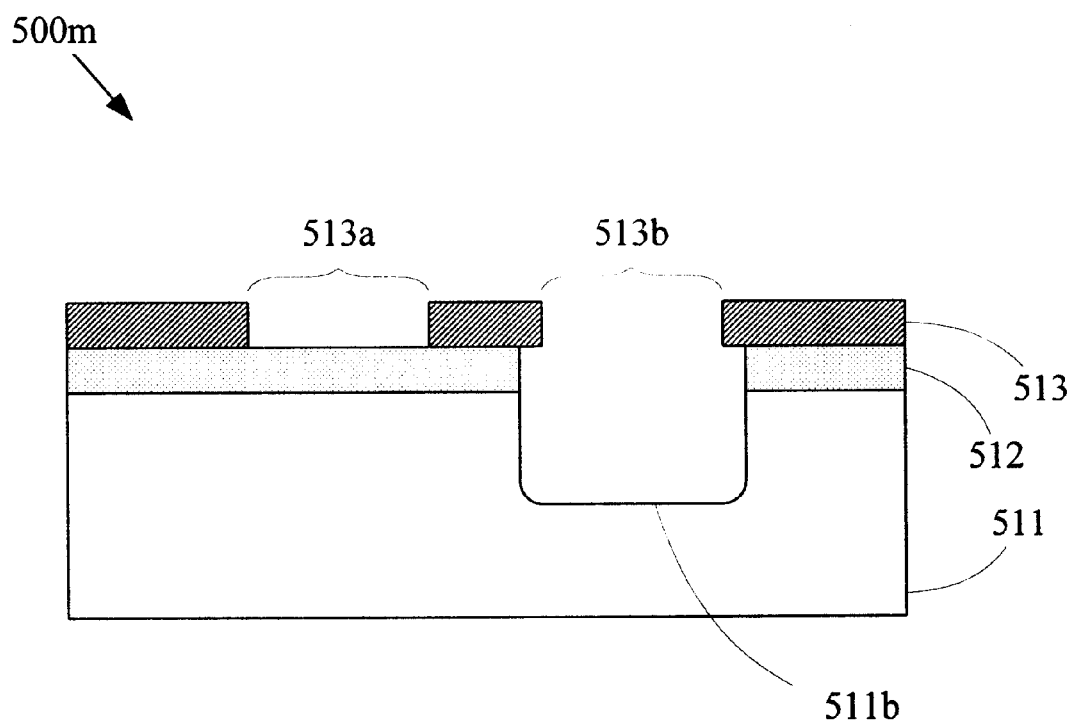

FIGS. 5L–5M demonstrate how such an "ITO blank" can be used in a PSM photomask-making operation, in accordance with an embodiment of the invention. FIG. 5L shows an intermediate stage in a PSM photomask-making process, wherein pattern layer 513 has been etched and secondary resist layer 540 has been developed away over pattern layer aperture 513b in the manner described in relation to FIGS. 5A–5E. Because ITO layer 512 is electrically conductive, it allows an e-beam exposure tool to be used for the phase level patterning operation. However, rather than subsequently performing a dry etch through aperture 513b, a wet etch is performed, depicted in FIG. 5L. The process etches through ITO layer 512 and into quartz substrate 511. Secondary resist layer 540 is then stripped away, thereby leaving completed PSM photomask 500m, as shown in FIG. 5M. The wet etch simultaneously undercuts pattern layer 513 and etches quartz pocket 511b. Because ITO layer 512 is visually transparent, the portion at aperture 513a does not have to be removed. However, the depth of etched pocket 511b must be sized to account for the refractive index of the ITO layer when performing the phase shifting calculations. Note also that aperture 513a can be sized down (or up) to further compensate for diffraction effects at aperture 513b (due to pocket 511b) or transmission losses at aperture 513a (due to ITO layer 512).

Thus, a technique for producing a PSM photomask using an e-beam exposure process during the phase level patterning operation has been described. Although the invention has been described in connection with several embodiments, it is understood that this invention is not limited to the embodiments disclosed, but is capable of various modifications, which would be apparent to a person skilled in the art. For example, with creating a PSM photomask from an ITO blank as described in relation to FIGS. 5L–5M, a dry etch could be performed before the wet etch to provide greater control over the depth of quartz pocket 511b. Also, quartz substrate 511 could be replaced with any similarly transparent material. In addition, software in accordance with the invention can be used to model, specify, or control production of a PSM photomask from a conductive blank. Thus, the invention is limited only by the following claims.

What is claimed is:

1. A method for creating a phase-shift masking (PSM) photomask, the method comprising:
    patterning a photomask blank with a first pattern, wherein the photomask blank comprises:
        a transparent substrate;
        a conductive layer formed on the quartz substrate; and
        a pattern layer formed on the conductive layer,
    wherein the first pattern is etched through the pattern layer, thereby forming a first aperture and a second aperture; and
    patterning the photomask blank with a second pattern,
    wherein the second pattern is etched through the conductive layer and into the transparent substrate at the second aperture, and
    wherein a difference in a thickness of the transparent substrate at the first and second apertures facilitates a phase shift differential for the PSM photomask.

2. The method of claim 1, wherein the transparent substrate comprises quartz.

3. The method of claim 1, wherein the pattern layer comprises chrome.

4. The method of claim 1, wherein the photomask blank comprises an e-beam exposure tool calibration blank.

5. The method of claim 1, the photomask blank further comprising a first resist layer,
    wherein patterning the photomask blank with the first pattern comprises:
        exposing the first pattern into the first resist layer, the first pattern comprising a first feature and a second feature;
        performing a first etch operation to transfer the first pattern into the pattern layer, the first feature and the second feature controlling the formation of a the first aperture and a the second aperture, respectively, in the pattern layer; and
        stripping the first resist layer from the photomask blank.

6. The method of claim 5, wherein patterning the photomask blank with the second pattern comprises:
    applying a second resist layer over the pattern layer;
    exposing a the second pattern into the second resist layer, the second pattern comprising a third feature positioned over the second aperture;
    developing away the third feature in the second resist layer;
    performing a second etch operation through the second aperture; and
    stripping the second resist layer from the photomask blank.

7. The method of claim 6, wherein the conductive layer comprises a visually transparent layer.

8. The method of claim 7, wherein the conductive layer comprises indium-tin-oxide.

9. The method of claim 7, wherein the second etch operation comprises an isotropic etch process.

10. The method of claim 6, further comprising performing a third etch operation through the first aperture and the second aperture, the third etch operation removing the conductive layer at the first aperture.

11. The method of claim 10, wherein the second etch operation comprises an anisotropic etch process and the third etch operation comprises an isotropic etch process.

12. The method of claim 11, wherein the second etch operation comprises a first anisotropic etch process, the method further comprising:
performing a third etch operation through the first aperture and the second aperture, the third etch operation comprising a second anisotropic etch process; and
performing a fourth etch operation through the first aperture and the second aperture, the fourth etch operation comprising an isotropic etch process.

13. The method of claim 1, wherein the second pattern is etched through the conductive layer at the first aperture.

14. A phase-shift masking (PSM) photomask comprising:
a transparent substrate;
a conductive layer formed on the transparent substrate, the conductive layer being electrically conductive; and
a pattern layer formed on the conductive layer, the pattern layer comprising a first aperture and a second aperture for transmitting radiation in a first phase and a second phase, respectively, the first phase and the second phase being substantially 180 degrees out of phase, wherein the first aperture is formed in at least the pattern layer, and wherein the second aperture is formed in the pattern layer, the conductive layer, and the transparent substrate.

15. The PSM photomask of claim 14, wherein the transparent substrate comprises quartz.

16. The PSM photomask of claim 14, wherein the pattern layer comprises chrome.

17. The PSM photomask of claim 14, wherein the pattern layer, the conductive layer, and the transparent substrate are provided by a photomask blank.

18. The PSM photomask of claim 17, wherein the photomask blank comprises an electron beam exposure tool calibration blank.

19. The PSM photomask of claim 14, the transparent substrate having a first index of refraction n, the radiation having a first wavelength $\lambda$, and the transparent substrate having a first thickness under the first aperture and a second thickness under the second aperture, wherein the difference between the first thickness and the second thickness is substantially equal to $\lambda/(2n-1)$.

20. The PSM photomask of claim 14, wherein the radiation exits the first aperture and the second aperture having a first intensity and a second intensity, respectively, the first intensity and the second intensity being substantially equal.

21. The PSM photomask of claim 20, wherein the conductive layer and the transparent substrate undercut the second aperture.

22. The PSM photomask of claim 21, wherein the conductive layer and the transparent substrate undercut the first aperture.

23. The PSM photomask of claim 14, wherein the conductive layer is visually transparent, and wherein the conductive layer is intact under the first aperture.

24. The PSM photomask of claim 23, wherein the conductive layer comprises indium-tin-oxide.

25. A photomask blank for forming a phase-shift masking (PSM) photomask, the photomask blank comprising:
a transparent substrate for forming first portions of first apertures;
a conductive layer for at least forming second portions of the first apertures, the conductive layer being formed on the transparent substrate; and
a pattern layer for at least forming third portions of the first apertures and first portions of second apertures, the pattern layer being formed on the conductive layer,
wherein a difference in a thickness of the transparent substrate at the first and second apertures provides a phase shift differential for the PSM photomask.

26. The photomask blank of claim 25, wherein the transparent substrate comprises quartz.

27. The photomask blank of claim 25, wherein the pattern layer comprises chrome.

28. The photomask blank of claim 25, wherein the conductive layer is visually transparent.

29. The photomask blank of claim 28, wherein the conductive layer comprises indium-tin-oxide.

30. The photomask blank of claim 25, wherein the conductive layer comprises a conductive polymer.

31. A method for creating a phase-shift masking (PSM) photomask from a blank comprising a transparent substrate, a conductive layer formed on the transparent substrate, a pattern layer formed on the conductive layer, and a first resist layer formed on the conductive layer, the method comprising:
patterning the first resist layer with a first pattern, the first pattern comprising a first feature and a second feature;
performing a first etch operation to transfer the first pattern into the pattern layer, the first feature and the second feature controlling the formation of a first aperture and a second aperture, respectively, in the pattern layer;
stripping the first resist layer;
applying a second resist layer over the pattern layer;
exposing a third feature into the second resist layer, the third feature being positioned over the second aperture;
developing away the third feature in the second resist layer; and
performing a second etch operation through the second aperture, wherein the second etch operation etches through the conductive layer and into the transparent substrate.

32. The method of claim 31, further comprising:
stripping the second resist layer; and
performing a third etch operation through the first and second apertures.

33. The method of claim 32, wherein the third etch operation through the first aperture etches through the conductive layer and reduces the transparent substrate at the first aperture to a first thickness, wherein the third etch operation through the second aperture reduces the transparent substrate at the second aperture to a second thickness, and wherein radiation exits the first aperture and the second aperture having a first phase and a second phase, respectively, the first phase being substantially 180 degrees out of phase with the second phase.

34. The method of claim 33, wherein the third etch operation undercuts the pattern layer at the first aperture and the second aperture.

35. An integrated circuit (IC) produced by a process comprising a photolithography operation, the photolithography operation being performed using a phase-shift masking (PSM) photomask, the PSM photomask comprising:

a transparent substrate;

a conductive layer formed on the transparent substrate; and a pattern layer formed on the conductive layer, wherein a first aperture extends through the pattern layer and the conductive layer into the transparent substrate, and wherein a second aperture extends through at least the pattern layer.

36. The IC of claim 35, wherein the pattern layer, the conductive layer, and the transparent substrate are provided by a photomask blank used to make the PSM photomask.

37. The IC of claim 35, wherein radiation exits the first aperture and the second aperture in a first phase and a second phase, respectively, and wherein the first phase and the second phase are substantially 180 degrees out of phase.

38. The IC of claim 37, wherein the conductive layer and the transparent substrate undercut the second aperture.

39. The IC of claim 38, wherein the conductive layer and the transparent substrate undercut the first aperture.

40. A software program for producing a phase-shift masking (PSM) photomask from a photomask blank, the photomask blank comprising a transparent substrate, a conductive layer formed on the transparent substrate, and a pattern layer formed on the conductive layer, the software program comprising:

means for associating a first etch specification with a first feature in a pattern layer layout, the first etch specification controlling a first etch process through the conductive layer and into the transparent substrate at the first feature.

41. The software program of claim 40, further comprising:

means for determining the first etch specification based on a plurality of reference values, the plurality of reference values including chemistry of the first etch process and physical properties of the conductive layer and the transparent layer.

42. The software program of claim 41, further comprising:

means for associating a second etch specification with the first feature and a second feature in the pattern layer layout, the second etch specification controlling a second etch process into the transparent substrate at the first feature and through the conductive layer at the second feature.

43. The software program of claim 41, wherein the software program controls an etch system.

* * * * *